(12) United States Patent
Hauptvogel et al.

(10) Patent No.: US 12,632,324 B2
(45) Date of Patent: May 19, 2026

(54) ERROR ANALYSIS IN A SENSOR ARRAY IN RESPECT OF UNSTABLE ERRORS

(71) Applicant: Volkswagen Aktiengesellschaft, Wolfsburg (DE)

(72) Inventors: Mathias Hauptvogel, Weferlingen (DE); Dennis Uhde, Braunschweig (DE); Tom Padeken, Jaderberg (DE); Matthias Lauber, Gifhorn (DE); Gerrit Mutke, Braunschweig (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 465 days.

(21) Appl. No.: 18/249,199

(22) PCT Filed: Oct. 1, 2021

(86) PCT No.: PCT/EP2021/077047
§ 371 (c)(1),
(2) Date: Apr. 14, 2023

(87) PCT Pub. No.: WO2022/083999

PCT Pub. Date: Apr. 28, 2022

(65) Prior Publication Data

US 2023/0393921 A1 Dec. 7, 2023

(30) Foreign Application Priority Data

Oct. 19, 2020 (DE) .......................... 102020213117.1

(51) Int. Cl.
*G06F 11/07* (2006.01)
*G01R 31/28* (2006.01)
(Continued)

(52) U.S. Cl.
CPC ........ *G06F 11/076* (2013.01); *G01R 31/2829* (2013.01); *G06F 11/327* (2013.01); *G08B 21/182* (2013.01)

(58) Field of Classification Search
CPC .. G06F 11/076; G06F 11/0754; G06F 11/327; G01R 31/2829; G08B 21/182; G05B 23/02
See application file for complete search history.

(56) References Cited

U.S. PATENT DOCUMENTS

| | | | | |
|---|---|---|---|---|
| 2006/0150018 A1* | 7/2006 | Cousin | ................ | G06F 11/2257 |
| | | | | 714/26 |
| 2007/0103006 A1* | 5/2007 | Zushi | ................... | H03K 17/687 |
| | | | | 307/130 |

(Continued)

FOREIGN PATENT DOCUMENTS

| | | | | | |
|---|---|---|---|---|---|
| CN | 111289921 A | * | 6/2020 | ......... | G01R 31/2601 |
| JP | H0782058 B2 | | 1/1988 | | |

OTHER PUBLICATIONS

Machine translation of CN 111289921, 2020.*

(Continued)

*Primary Examiner* — Manuel L Barbee
(74) *Attorney, Agent, or Firm* — Peter Zura; LOZA & LOZA, LLP

(57) ABSTRACT

Technologies and techniques for analyzing a sensor array for unstable errors, wherein the sensor array emits an analog sensor signal according to a measured variable, a number of error events is identified within a given time interval, the sensor signal having a first slope and a second slope for each of the error events. A diagnostic signal is generated according to a cumulative height of the first and/or the second (Continued)

slopes and is compared with a first threshold value. An error message is generated according to a result of the comparison.

20 Claims, 6 Drawing Sheets

(51) Int. Cl.
     *G06F 11/32*          (2006.01)
     *G08B 21/18*          (2006.01)

(56)                    References Cited

U.S. PATENT DOCUMENTS

2010/0004814 A1 *   1/2010   Nagata ................ F02D 41/2406
                                              701/31.4
2016/0031324 A1 *   2/2016   Kim ...................... H02J 7/0048
                                              701/34.4

OTHER PUBLICATIONS

PCT/EP2021/077047. International Search Report (Jan. 21, 2022).
Priority Appln. No. DE102020213117.1. Office Action (Aug. 11, 2022).

* cited by examiner

ERROR ANALYSIS IN A SENSOR ARRAY IN RESPECT OF UNSTABLE ERRORS

RELATED APPLICATIONS

The present application claims priority to international Patent Application No. PCT/EP2021/077047 to Hauptvogel, et al., titled "Error analysis in a sensor array in respect of unstable errors", filed Oct. 1, 2021, which claims priority to German Patent App. No. DE 10 2020 213 117.1, filed Oct. 19, 2020, the contents of each being incorporated by reference in their entirety herein.

FIELD OF TECHNOLOGY

The present disclosure relates to technologies and techniques for error analysis in a sensor array in respect of unstable errors, the sensor array outputting an analog sensor signal as a function of a measured variable. The present disclosure further relates to a diagnostic device for error analysis in a sensor array in respect of unstable errors.

BACKGROUND

Errors in analog sensor arrays or in connection lines of analog sensor arrays have an impact on the accuracy and reliability of the functions and devices that go on to use the analog sensor output signal. This applies, for example, in the context of automotive applications, where various analog sensors, such as pressure sensors, temperature sensors, acceleration sensors and so forth are used. Pressure and temperature sensors may be used for engine control, for example. In particular, an engine control unit may control the engine torque as a function of measured pressure or temperature values. In this specific example, erroneous output signals from the analog sensors thus have a direct impact on the performance, exhaust emissions, and reliability of the motor vehicle. This applies analogously to other applications.

However, not only stable errors are relevant, for example permanent short circuits or permanently open contacts, but also unstable errors, in which the error state, for example the short circuit or the open contact, occurs intermittently. In this context, reference may be made to intermittent errors, periodic contact breakage, periodically intermittent short circuits or periodically intermittent open contacts, or, colloquially, loose contacts. These unstable errors may also, for example in the automotive context, have an impact on performance, fuel consumption or the composition of exhaust gases. It is therefore fundamentally desirable to be able to detect unstable errors in analog sensors reliably.

Depending on the severity or the criticality or relevance of the unstable error, different measures or consequences may be useful or desirable.

WO 2020/058001 A1 describes a method and a device for diagnosing a lambda probe. A diagnostic DC voltage or a diagnostic AC voltage is fed into the lambda probe, and drops across a Nernst cell of the lambda probe. A distinction can be made between a short circuit and a line break in the Nernst cell, depending on whether a direct or alternating voltage is detected at the corresponding terminals at which the voltage is fed in, and optionally depending on the amplitude of the detected voltage.

However, this method is designed specifically for diagnosing a lambda probe and cannot be transferred to just any analog sensors. In addition, the diagnostic principle of feeding in a diagnostic voltage and analyzing the corresponding response is not suitable for unstable errors.

SUMMARY

Against this background, aspects of the present disclosure are to set out improved configurations for error analysis in an analog sensor array, by means of which the severity of a detected unstable error can be taken into account.

Certain aspects are achieved by the subject matter of each of the independent claims. Advantageous developments and preferred embodiments form the subject matter of the dependent claims.

The present disclosure is based on the idea of determining the cumulative height of signal edges of an analog sensor signal within a predetermined time interval and generating an error message as a function thereof.

In some examples, a method for error analysis in a sensor array in respect of unstable errors is disclosed. The sensor array outputs an analog sensor signal as a function of a measured variable. A number of error events is identified within a predetermined time interval using a diagnostic device, the sensor signal for each error event having a first edge and a second edge following the first edge. A diagnostic signal is generated by the diagnostic device as a function of a cumulative height of the first edges and/or the second edges. The diagnostic signal is compared with a first threshold by the diagnostic device, and an error message is generated by the diagnostic device as a function of a result of the comparison.

In some examples, a diagnostic device is disclosed that is configured to execute the methods and processes of the various configurations disclosed herein. In some examples, a diagnostic device may be configured or programmed to carry out one or more methods of the present disclosure.

In some examples, a sensor device is disclosed. The sensor device may include an analog sensor array or an analog sensor and a diagnostic device in accordance with the present disclosure, wherein the analog sensor array and/or the analog sensor being coupled or connected to the diagnostic device, and the connection in particular being configurable directly or indirectly via one or more further components of the sensor array.

In at least one embodiment of the sensor device, the sensor may be configured as a pressure sensor, for example as an intake manifold pressure sensor for a motor vehicle, or as a temperature sensor, for example as an intake air temperature sensor for a motor vehicle.

In some examples, the sensor device or the diagnostic device may include a low-pass filter, for example an RC element. The low-pass filter is set up to generate a filtered output signal from the sensor signal as a function of an output signal from the sensor. The low-pass filter may be arranged, for example, between the analog sensor and the diagnostic device.

In some examples, a motor vehicle is disclosed, having a diagnostic device and/or sensor device in accordance with the present disclosure.

In at least one embodiment of the motor vehicle, the motor vehicle has an engine control unit and the engine control unit that contains the diagnostic device or the evaluation unit of the diagnostic device.

The present disclosure also includes the combinations of features of the described embodiments.

DETAILED DESCRIPTION

Figure 1:
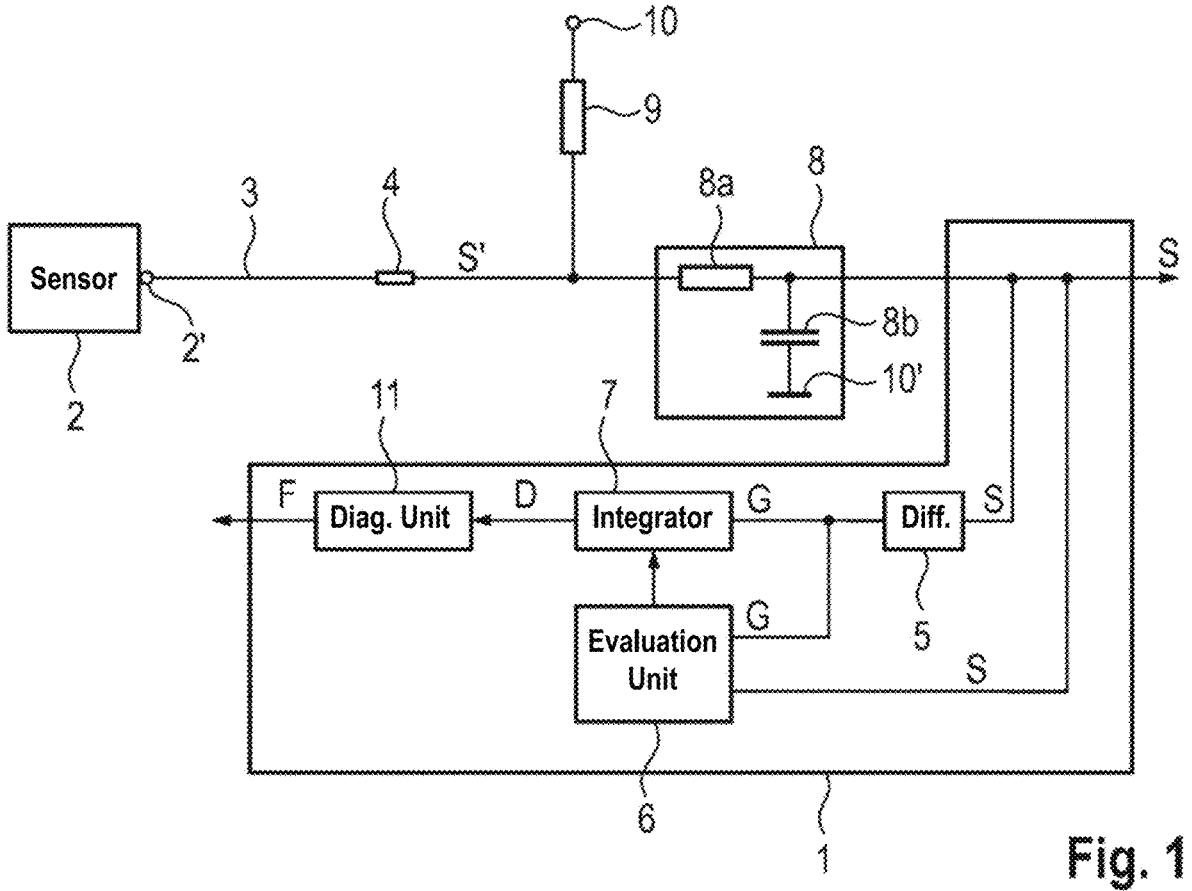
FIG. 1 is an illustrative schematic representation of a diagnostic device and a sensor device according to come aspects of the present disclosure.

The exemplary embodiments explained herein are preferred example embodiments of the invention. In the example embodiments, the described components each represent individual features of the invention, which are to be considered independently of one another, and which also develop the invention independently of one another and are therefore also to be regarded as part of the invention individually or in a combination other than that shown.

Furthermore, the described example embodiments can also be supplemented with other previously described features of the invention.

Functionally equivalent elements are provided with the same reference signs in each of the drawings.

As used herein, a sensor or sensor array that outputs an analog sensor signal as a function of the value of the measured variable, in other words in which an amplitude or magnitude of the sensor signal changes continuously or substantially continuously with the value of the measured variable, is referred to as an "analog sensor" or "analog sensor array." The sensor array may include the analog sensor and optionally an analog-to-digital converter. The analog-to-digital converter can convert the analog sensor signal into a digitized sensor signal. In accordance with the present disclosure, however, the analog, non-digitized sensor signal is used, as described herein.

For example, in addition to the sensor, the sensor array may also have a filter unit or other components. The sensor signal may correspond to a direct output signal from the sensor or to a pre-processed, for example filtered, output signal from the sensor.

An unstable error may be understood herein as an error that is not continuously or permanently present and/or the effects of which, with respect to the sensor signal, cannot be measured continuously or permanently, or the effects of which are variable over time. In particular, the unstable error may also be regarded and referred to as an intermittent error.

The sensor signal may correspond to a current or voltage that can be measured at a measuring connection to which the diagnostic device is directly or indirectly connected. In this case, the measuring connection is connected directly or indirectly to a signal connection of the sensor, for example by wire. The magnitude or amplitude of the sensor signal corresponds to the value of a physical measured variable. Depending on the embodiment of the sensor, this may involve different measured variables, such as a pressure, a temperature, an acceleration, and so forth. In various configurations, further electronic components, for example signal filters or the like, may also be arranged between the sensor output and the measuring connection. The sensor signal then corresponds, for example, to the filtered output signal of the sensor.

If the connection between the sensor output and the measuring connection is faulty, for example broken or short-circuited, the signal measured at the measuring connection does not necessarily correspond to the signal present at the sensor output. The signal measured at the measuring connection, which may also be regarded as an apparent sensor signal, is nevertheless referred to here and in the following as a sensor signal, since the diagnostic device cannot per se distinguish this signal from an actual sensor signal.

In some examples, the diagnostic device may include, for example, an electronic control unit for a motor vehicle, a microcontroller or other computing unit or processor unit, and/or other analog and/or digital circuits.

If the sensor array is configured or provided for a motor vehicle, the motor vehicle may, for example, have an electronic control unit that receives the sensor signal so as to carry out one or more vehicle functions, for example engine control. The diagnostic device may be part of this electronic control unit or be configured separately therefrom.

As used herein, an edge may be understood as a signal edge of an analog signal, in particular of the analog sensor signal. An analog signal may be said to have an edge in particular if the amplitude of the signal or the magnitude of the amplitude of the signal changes by a predefined minimum value or more within a predefined period of time, in particular changes in a monotonically increasing or monotonically decreasing manner. In this context, the predefined period of time or the minimum value or their relationship to one another are to be defined in accordance with the specific application situation and in particular in accordance with the configuration of the sensor and the value range of the sensor signal.

The height of an edge may correspond to the change in the amplitude or in the magnitude of the amplitude within the predefined period of time. If, for example, a gradient signal of the sensor signal is considered, in other words a time-dependent signal that corresponds or approximately corresponds to the derivative of the sensor signal with respect to time, the height of an edge can be determined in particular by integrating the gradient signal over the predefined period of time. The gradient signal can be determined, for example, via a differentiator, in particular via an analog differentiator circuit or by means of a digital evaluation circuit or some other computing unit.

The cumulative height may be understood, for example, as corresponding to the sum of the determined heights of all first edges of the number of error events or to the sum of all heights of the second edges of the error events. The cumulative height may also correspond to the sum of all heights of all first and second edges of the number of error events, but always using positive values for the heights or always using negative values for the heights.

The cumulative height can also be determined, for example, by summing or integrating, for example, the gradient signal over the appropriate periods of time.

In some examples, the fact of the sensor signal having a first and a second edge can be regarded as a necessary but not a sufficient criterion for the presence of an error event. In particular, in addition to the mere presence of corresponding edges, other conditions may also be required in order for the section of the sensor signal to be identifiable as an error event. These further conditions may relate to the respective heights of the edges, magnitudes of the sensor signal and/or gradients of the edges, and so forth.

For some analog sensors, the sensor signal may for example take on values in a range from 0 to a few volts, for example up to 5 V or 10 V. With a sensor of this type, an edge may be referred to, for example, if the magnitude of the sensor signal changes by a few volts within a few tens of ms or a few hundred ms. This numerical example merely serves to clarify the concept of the edge, and is not to be understood as in any way limiting.

The fact of the second edge following the first edge may be understood in particular as there being no further edge of the sensor signal between the first edge and the second edge. However, this does not necessarily imply that the second edge immediately follows the first edge. Rather, the amplitude or magnitude of the sensor signal between the first and the second edge may be more or less constant or may change without the condition explained above for an edge being met.

As a result of the configurations of the present disclosure, the cumulative height may thus be used as a measure of the severity of the number of error events within the predetermined time interval. This takes account of the fact that the mere number of identified error events within a predetermined time interval is not sufficient, on its own, to determine whether the unstable error will have a significant or relevant effect on a subsequent function that uses the sensor signal. However, the cumulative height and the first threshold, which is to be defined depending on the application and sensor design, allow a precise and individual determination as to which error signature is to be regarded as relevant within a predetermined time interval. In particular, this also makes it possible to carry out the error analysis for a wide range of sensor types or fields of application without structural adjustments to the diagnostic device and without fundamental adjustments to the method. If the unstable error is, for example, critical for a safety-related function of a motor vehicle, for example engine control, then an error message can be outputted at a lower cumulative height than, for example, for a purely comfort-related function, for example the temperature control of a vehicle interior. This significantly increases the flexibility of the error analysis.

The severity of the number of error events does not necessarily have to be given solely by the cumulative height. Rather, in various embodiments, the diagnostic device may take into account further properties of the signal profile of the sensor signal and/or the sensor signal. For this purpose, the diagnostic signal may be generated, for example, as a function of the cumulative height and of the further properties. Alternatively, a further diagnostic signal may also be generated as a function of the further properties. The above and following explanations regarding the diagnostic signal can be applied analogously to the further diagnostic signal.

For example, the range of values for the sensor signal may be limited, for example on the basis of the specific configuration of the sensor. If the sensor signal reaches a corresponding upper limit or lower limit, the height of the corresponding edge is also limited as a result. For events of this type, however, the severity of the error may depend on how long the sensor signal dwells at the upper limit or lower limit. In various embodiments, the diagnostic signal or the further diagnostic signal may therefore be generated as a function of a cumulative dwell time of the sensor signal at the upper limit and/or the lower limit. For this purpose, the sensor signal itself may be summed or integrated over the corresponding periods of time.

Alternatively, the gradient signal may be modified in such a way that it takes on a predefined non-zero value, in particular being set to this value as long as the sensor signal dwells at the upper limit or the lower limit. In these embodiments, the dwelling of the sensor signal at the upper limit or the lower limit is effectively evaluated as a further rise in the sensor signal, meaning that the height of the corresponding edge is artificially increased.

By taking into account the dwell time of the sensor signal at the upper limit or the lower limit, the severity of the error is estimated more precisely, increasing the reliability of the method.

In addition to generating and potentially outputting the error message, a further measure, for example a risk reduction measure, may also be initiated by the diagnostic device or by another electronic control unit or another further processing unit depending on a result of the comparison of the diagnostic signal with the first threshold. For example, operating parameters or functional parameters of the motor vehicle may be adjusted or restricted when the error message is generated. The measure may also be initiated on the basis of the error message. Alternatively or additionally, error information may be outputted to a driver or user of the motor vehicle, for example in an acoustic, visual and/or haptic form. Alternatively or additionally, the diagnostic device may also store an entry in an error memory depending on the error message.

In some examples, a counter value may be changed by the diagnostic device depending on the result of the comparison of the diagnostic signal with the first threshold. The changed counter value is compared with a second threshold by the diagnostic device, and the error message is generated by the diagnostic device as a function of a result of the comparison of the changed counter value with the second threshold.

In particular, the counter value may be increased, in particular by a predefined increment, or not changed depending on the result of the comparison of the cumulative height with the first threshold. For example, the counter value is increased if the cumulative height is greater than or equal to the first threshold, and is not changed otherwise.

For example, the steps described above in relation to the predetermined time interval, namely identifying the number of error events, generating the diagnostic signal, comparing the diagnostic signal with the first threshold, are repeated for one or more further time intervals.

The diagnostic signal may be reset for each repetition, for example. Alternatively, a run-on time or decay time, within which the diagnostic signal returns continuously or in steps to its initial value, in particular zero, may also be defined. The run-on time or decay time may, for example, correspond to the duration of one or more time intervals. As a result, an error memory can to some extent be implemented, in such a way that error events from previous time intervals can also be partially taken into account when evaluating the severity of the error.

The fact of the diagnostic signal reaching or exceeding the first threshold during a time interval is therefore a necessary but not a sufficient condition for generating the error message. Rather, reaching or exceeding the first threshold during an individual time interval can be interpreted to the effect that a corresponding unstable error was identified in this time interval. However, to evaluate or assess the relevance or criticality of unstable errors, it may be advantageous or necessary, depending on the application, to know how often or for how long a corresponding unstable error occurs.

By dividing the analysis into the diagnosis of the individual time intervals in a first step and the comparison of the counter value with the second threshold in a second step, it is possible on the one hand to take into account a wide variety of error patterns or error signatures within a time interval, but on the other hand to output the error message as a function of how often an error of this type occurs or how persistently it occurs, regardless of what exact signature or what exact error pattern is present in the individual time intervals.

The diagnostic signal may reach or exceed the first threshold in an individual time interval as a result of the sensor signal having a very high edge or a few relatively high edges, but also as a result of the sensor signal having a large number of edges of a relatively low height in this time interval. In both cases, an unstable error would be identified in the corresponding time interval if the first threshold is exceeded. By comparing the counter value with the second threshold, it is then achieved that individual errors or a few unstable errors do not lead to the generation of the error message in spite of there potentially being no significant impairment of a relevant function. This increases the availability of the sensor array or of the function.

If, instead of the two-stage check, a much longer time interval were considered and a second step were dispensed with, only the value of the diagnostic signal itself could be used for the evaluation. However, the number of times a particular threshold was exceeded would not be taken into account. By contrast, in the above-mentioned embodiments of the improved configurations, exceeding the first threshold during a time interval has the same consequence regardless of how greatly or for how long the first threshold is exceeded. As a result, the relevance of the number of unstable errors is weighted more heavily than the relevance of the actual height of the edges.

In at least one embodiment, a start time and an end time of the time interval are or become predetermined.

This can be done, for example, by explicitly predetermining the start and end times or by predetermining the start time and a duration of the time interval or the duration of the time interval and the end time. The various time intervals of the corresponding repetitions are therefore, in particular, directly consecutive time intervals, the time position of the time intervals being independent of the profile of the sensor signal itself. An embodiment of this type has the advantage that it is possible to predetermine the time intervals in a particularly simple manner.

In some examples, the duration of the time interval is or becomes predetermined, and the start time of the time interval corresponds to the first edge of an initial error event of the number of error events.

In other words, the time interval only runs when a first edge of an error event is initially identified.

In at least one embodiment, a totality of error events within the time interval is identified by the diagnostic device, the sensor signal for each error event of the totality of error events having a first edge and a second edge following the first edge. The number of error events corresponds to a subset of the totality of error events.

In at least one embodiment, for each error event of the totality of error events an error type out of at least two predefined error types is determined by the diagnostic device as a function of the associated first edge and the associated second edge. The number of error events corresponds to a subset of the totality of error events, the same error type being determined for all error events of the number of error events or of the subset.

In other words, an individual failure mode out of the two or more predetermined failure modes can be considered and analyzed as described above. This has the advantage that different error types, which may possibly occur simultaneously, are not mixed up in the evaluation despite potentially arising from different causes. This increases the reliability and reproducibility of the error analysis.

For example, a corresponding diagnostic signal may be generated by the diagnostic device for each error type out of the at least two predefined error types, for which the above and following statements apply analogously.

The at least two error types may include, for example, an error type that corresponds to an open circuit of the signal output of the sensor. The open circuit may be understood to mean a state in which the electrical connection of the measuring connection to the signal connection is interrupted, in other words is to some extent not connected ("floating"). This state may also be referred to as an "open circuit". The two or more error types may also include one or more error types that each correspond to a short circuit of the signal output. Depending on the embodiment, different error types may be provided for short circuits having different reference points or reference potentials, or a shared error type may be provided for short circuits.

In some examples, the gradient signal may be generated as a function of the sensor signal by the diagnostic device, in particular a differentiator. For each error event of the totality of error events, an edge category from at least two predefined edge categories is assigned to the associated first edge and an edge category from the at least two edge categories is assigned to the associated second edge by the diagnostic device. The error type is determined by the diagnostic device as a function of the error category assigned to the first edge and the edge category assigned to the second edge.

In these embodiments, the two consecutive edges of an error event are thus analyzed using the gradient signal, and thus how strongly the associated edge rises or falls, so as to define associated edge categories. The error type can then be determined on the basis of the two edge categories, for example on the basis of the successive sequence of different edge categories. As a result, the method is particularly suitable for identifying and characterizing unstable errors, such as intermittent short circuits or open circuits or other periodic contact breakage or loose contacts.

Because only the sensor signal generated and used for the underlying application is processed and evaluated to determine the error type, it is not necessary to generate additional specific analysis signals and evaluate the signal response of the sensor system to them. As a result, a method of this type can be used universally, without fundamental changes, for a large number of analog sensors or for any desired analog sensors. For this purpose, only parameters, limit values and the like may have to be adjusted in this example.

In some examples, the edge category may be assigned to the first edge on the basis of the gradient signal during a first time period, and the corresponding edge category may be assigned to the second edge on the basis of the gradient signal during a second time period. The first time period corresponds to a time period of the first edge, and the second time period corresponds to a time period of the second edge, this meaning associated time periods at which the corresponding edges occur in the sensor signal.

In at least one embodiment, determining the error type includes generating an output signal which encodes the error type as a function of the edge category assigned to the first edge and of the edge category assigned to the second edge. Alternatively, or additionally, determining the error type may include storing the information that an error of the associated error type has occurred. This may be done, for example, using one or more corresponding counters or using other storage methods.

In at least one embodiment, the at least two edge categories include a first edge category and a second edge category. For example, the first and the second edge category may each correspond to the presence of an error, thus not occurring in an error-free state of the sensor or of the connection of the signal output to the measuring connection.

In at least one embodiment, the at least two edge categories contain a third edge category and/or a fourth edge category. For example, the third and/or the fourth edge category may each correspond to the presence of an error.

In at least one embodiment, the at least two error types include an intermittent short circuit between a signal output of the sensor array and a reference potential connection and/or an intermittent open circuit of the signal output.

In at least one embodiment, for each error event of the totality of error events, the diagnostic device assigns the associated first edge to the first edge category out of the at least two edge categories only if the gradient signal exceeds a predefined positive first gradient limit value during the first edge.

In at least one embodiment, for each error event of the totality of error events the diagnostic device assigns the associated second edge to the first edge category only if the gradient signal exceeds the first gradient limit value during the second edge.

As used herein, the phrases "during the first edge" and "during the second edge" may be understood as indicating a process during the corresponding period of time that corresponds to the associated edge and during which the edge is present in the sensor signal. The fact of the gradient signal exceeding a gradient limit value may be understood in particular as the gradient signal initially being less than or equal to the gradient limit value and then taking on a value greater than the gradient limit value. The fact of the gradient signal falling below a gradient limit value may be understood in particular as the gradient signal initially being greater than or equal to the gradient limit value and then taking on a value less than the gradient limit value. The sensor signal exceeding or falling below a signal limit value may also be understood analogously.

In other words, the first edge category is present if the edge in question corresponds to a rising edge of the sensor signal and the rise at least temporarily has a steepness that exceeds a steepness defined by the first gradient limit value. An edge of this type may also be referred to as a sudden rise in the sensor signal.

A value range for the amplitude of the sensor signal may be defined and limited by a first reference potential and a second reference potential. The first reference potential may also be referred to as the upper reference potential, and the second reference potential as the lower reference potential, the lower reference potential being lower than the upper reference potential. For example, the first reference potential may be a positive electrical potential, and the second reference potential may be a negative reference potential or a zero potential or ground potential. However, other definitions are also possible. In some examples, the upper reference potential may also correspond to the zero potential or ground potential, and the lower reference potential may correspondingly be negative.

The first edge category, in other words the sudden rise in the sensor signal, occurs in particular if a short circuit occurs between the signal output of the sensor and the upper reference potential. In addition, the first edge category occurs, for example, if a short circuit between the signal output and the lower reference potential is eliminated.

Accordingly, by analyzing the first and the second edge with respect to the first edge category, statements can be made about categorizing or determining the error type. In at least one embodiment, for each error event of the totality of error events, the diagnostic device assigns the first edge to a second edge category, out of the at least two edge categories, only if the gradient signal falls below a negative second gradient limit value during the first edge.

In at least one embodiment, for each error event of the totality of error events, the diagnostic device assigns the second edge to the second edge category only if the gradient signal falls below the second gradient limit value during the second edge.

The second edge category thus corresponds in particular to a falling edge of the sensor signal, the drop at least temporarily having a steepness, in particular a negative steepness, the magnitude of which is greater than the magnitude of the slope defined by the second gradient limit value. An edge of this type may also be referred to as a sudden drop in the sensor signal, for example.

A sudden drop of this type in the sensor signal occurs, for example, if the short circuit between the signal output and the upper reference potential is eliminated or if the short circuit between the signal output and the lower reference potential is established. Moreover, a sudden drop in the sensor signal may also occur if the open circuit of the signal output is terminated or eliminated. A more specific determination of the error type can therefore be made on the basis of the second edge category, in particular in combination with the first edge category.

In at least one embodiment, for each error event of the totality of error events, the diagnostic device assigns the associated first edge to the first edge category only if the sensor signal exceeds a first predefined signal limit value during the first edge, and/or the associated second edge is assigned to the first edge category only if the sensor signal exceeds the first signal limit value during the second edge.

In at least one embodiment, for each error event of the totality of error events, the diagnostic device assigns the first edge to the second edge category only if the sensor signal falls below a second signal limit value during the first edge and/or the second edge is assigned to the second edge category only if the sensor signal falls below the second signal limit value during the second edge.

In some examples, the magnitude of the first signal limit value is greater than the magnitude of the second signal limit value. In these embodiments, in addition to the gradient signal exceeding the first gradient limit value or the gradient signal falling below the second gradient limit value, a further condition is predetermined in each case for assigning the edge to the first or second edge category. In these embodiments, it is therefore not sufficient for the edge to rise or fall steeply enough, but rather it is also relevant whether the associated edge also exceeds or falls below a corresponding value of the sensor signal itself.

In some examples, this makes it possible to distinguish actual errors, such as short circuits or open circuits, from other causes that can lead to a rapid rise or fall in the sensor signal. This may be caused, for example, by a value of the underlying physical measurement variable that changes very quickly without there being an error. This is sometimes referred to as a load impact. However, error-free changes in the physical measurement variable with a high rate of change, in other words a steep rise or fall in the sensor signal, usually take place within particular limits that are smaller than the entire possible value range for the sensor signal. By selecting the first and/or second signal limit value in a correspondingly adapted manner, a reliable distinction can thus be made between errors and other causes of the change in the sensor signal. In other words, the risk of false positive error determinations can be reduced.

In at least one embodiment, for each error event of the totality of error events, the diagnostic device assigns the associated first edge to the first edge category if and only if the gradient signal exceeds the first gradient limit value during the first edge and the sensor signal exceeds the first signal limit value during the first edge.

In at least one embodiment, for each error event of the totality of error events, the diagnostic device assigns the associated second edge to the first edge category if and only if the gradient signal exceeds the first gradient limit value during the second edge and the sensor signal exceeds the first signal limit value during the second edge.

In at least one embodiment, for each error event of the totality of error events, the diagnostic device assigns the associated first edge to the second edge category if and only if the gradient signal falls below the second gradient limit value during the first edge and the sensor signal falls below the second signal limit value during the first edge.

In at least one embodiment, for each error event of the totality of error events, the diagnostic device assigns the associated second edge to the second edge category if and only if the gradient signal falls below the second gradient limit value during the second edge and the sensor signal falls below the second signal limit value during the second edge.

In at least one embodiment, the error type may be determined as an intermittent short circuit between the signal output of the sensor and a first reference potential connection if, in particular if and only if, the associated first edge has been assigned to the first edge category and the associated second edge has been assigned to the second edge category, the first reference potential connection being in particular at the first reference potential.

In other words, in this case there is initially a sudden rise in the sensor signal, and then a sudden fall in the sensor signal. If the short circuit with the first reference potential connection is established, the sensor signal takes on a value close to the first reference potential within a short time. If the short circuit is then corrected again, the sensor signal takes on the original value or another value that actually at least approximately corresponds to the physical measured variable, in such a way that the described edge sequence is established. In this way, the presence of an intermittent short circuit with the first reference potential connection can be reliably detected and categorized.

In at least one embodiment, the error type is determined as an intermittent short circuit between the signal output and a second reference potential connection if the first edge has been assigned to the second edge category and the second edge has been assigned to the first edge category, the first reference potential connection and the second reference potential connection being at different electrical reference potentials. In particular, the second reference potential connection is at the second reference potential.

In other words, in this case there is first a sudden drop in the sensor signal and then a sudden rise in the sensor signal. If the short circuit with the second reference potential connection is established, the sensor signal takes on a value close to the second reference potential within a short time. If the short circuit is then eliminated, the sensor signal returns to its original value or to another value that actually at least approximately corresponds to the physical measured variable, in such a way that the described edge sequence is established.

In at least one embodiment, for each error event of the totality of error events the diagnostic device assigns the associated first edge to a third edge category out of the at least two edge categories only if the gradient signal during the first edge exceeds a predefined positive third gradient limit value and does not exceed the first gradient limit.

In this case, the third gradient limit value may be smaller than the first gradient limit value. In other words, in a situation of this type there is a signal rise in the sensor signal that is not as steep as a sudden rise according to the above definition but that is at least as steep as is required by the third gradient limit value. On the basis of embodiments of this type, in accordance with the improved configurations, a distinction can be made between sudden rises in the sensor signal and other error-related signatures of the sensor signal. This makes it possible to implement a more specific determination of the error type.

For example, an edge of the third edge category may occur if an open circuit of the signal output is generated. In a case of this type, the signal output measured as a sensor signal can be charged from the first reference potential, for example via provided or parasitic ohmic resistances and/or capacitances, resulting in a slower signal rise by comparison with the sudden rise in the sensor signal described above. As a result, in corresponding embodiments, a reliable distinction can be made between a short circuit between the signal output and the first reference potential and the open circuit of the signal output.

In at least one embodiment, the error type is determined as an intermittent open circuit of the signal output if the associated first edge has been assigned to the third edge category and the associated second edge has been assigned to the second edge category.

In at least one embodiment, for each error event of the totality of error events, the diagnostic device assigns the associated first edge to the third edge category only if the gradient signal falls below a negative fourth gradient limit value during the first edge and does not fall below the second gradient limit value.

In these embodiments, the statements made above in relation to the third edge category apply analogously, an inverted polarity of the reference potential connections being assumed.

In at least one embodiment, the error type is determined as an open circuit of the signal output if the associated first edge has been assigned to the third edge category and the associated second edge has been assigned to the first edge category.

In some examples, a diagnostic device for error analysis in a sensor array with respect to unstable errors is also set out. The sensor array is set up to output an analog sensor signal as a function of a measured variable. The diagnostic device contains an evaluation unit that is set up to identify a number of error events within a predetermined time interval, the sensor signal for each error event having a first edge and a second edge following the first edge. The diagnostic device has a cumulative unit or an integrator unit that is set up to generate a diagnostic signal as a function of a cumulative height of the first edges and/or the second edges. The diagnostic device has a diagnostic unit that is set up to compare the diagnostic signal with a first threshold and to generate an error message as a function of a result of the comparison.

The sensor array is not necessarily part of the diagnostic device. The diagnostic device may, for example, have a connection for connecting the sensor array or the sensor, in particular in order to connect the signal output of the sensor to the diagnostic device.

In at least one embodiment, the diagnostic device has a differentiator that is set up to generate the gradient signal as a function of the sensor signal.

In at least one embodiment, the cumulation or integration unit is set up to generate the diagnostic signal as a function of the gradient signal.

FIG. 1 schematically shows an exemplary embodiment of a diagnostic device 1 in accordance with aspects of the present disclosure. A sensor array that contains an analog sensor 2 is also shown. The diagnostic device 1 and the sensor array may for example be part of a sensor device in accordance with aspects of the present disclosure. The sensor 2 has a signal output 2', at which it can output an analog output signal S', in particular a sensor voltage. The output signal S' may be provided at a sensor connection 4 of the sensor array or of the diagnostic device 1, which is connected to the signal output 2' by one or more electrical lines 3.

FIG. 1 also shows a low-pass filter 8 of the sensor array, which is shown schematically as an RC element having a resistor 8a and a capacitor 8b. The capacitor 8b is connected at one terminal to a second reference potential connection 10' and at another terminal to a terminal of the resistor 8a. The further terminal of the resistor 8a is coupled to a first reference potential connection 10, in particular via a pull-up resistor 9. Accordingly, the low-pass filter 8 can output, at one output thereof, a filtered output signal, which may be regarded as a sensor signal S. In alternative embodiments, the output signal S' may also be regarded as a sensor signal.

The low-pass filter 8 and/or the pull-up resistor 9 may be part of a control unit for a motor vehicle, for example. It is noted that other embodiments of the low-pass filter 8 may also be provided. When the sensor 2 is operating correctly, it supplies the output signal S' via the signal connection 4 to the low-pass filter 8, which generates the sensor signal S accordingly.

The diagnostic device 1 has, for example, a differentiator 5, which is connected to the low-pass filter 8 so as to receive the sensor signal S. The differentiator 5 is set up to differentiate the sensor signal S and thereby to generate a gradient signal G. The diagnostic device 1 also has an evaluation unit 6, which is connected to the low-pass filter 8 so as to obtain the sensor signal S and is connected to an output of the differentiator 5 in order to obtain the gradient signal G.

Further, the diagnostic device 1 has an integrator 7, which is connected to the output of the differentiator 5 so as to obtain the gradient signal G and can be controlled by the evaluation unit 6, for example. The integrator 7 can generate a diagnostic signal D on the basis of the gradient signal. The diagnostic device 1 further has a diagnostic unit 11, which is connected to the integrator 7 so as to receive the diagnostic signal D and can generate an error message F as a function of the diagnostic signal D.

The first reference potential connection 10 is at a first electrical potential, which for example is positive. The reference potential connection 10 may correspond to an output potential of a voltage source, for example. The second reference potential connection 10' is at a second electrical potential, for example at a ground potential.

The functionality of the diagnostic device 1 or sensor array is explained in greater detail below by way of various examples, with reference to FIG. 2 to 8.

Figure 8:
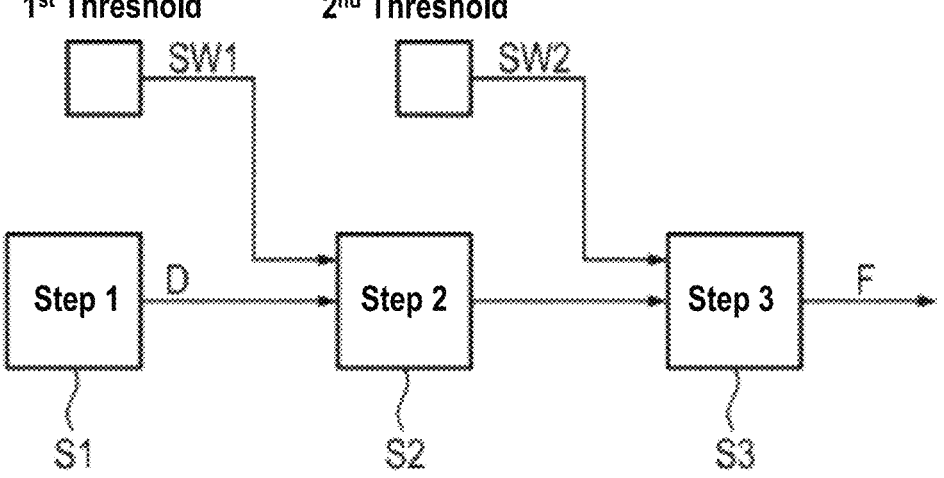
FIG. 8 is an illustrative schematic flow chart of an example embodiment of a method, according to come aspects of the present disclosure.

For this purpose, FIG. 8 presents a schematic flowchart of an example embodiment of a method for error analysis in a sensor array in respect of unstable errors in accordance with the improved configurations. In step S1 of the method, the diagnostic device 1, in particular the evaluation unit 6, identifies, as a function of the sensor signal S, a number of error events within a predetermined time interval. Each error event has a first edge and a second edge following the first edge. The integrator 7 receives the gradient signal G and is controlled by the evaluation unit 6 so as to generate, as a function of the gradient signal G, a diagnostic signal D that corresponds to a cumulative height of the second edges or a cumulative height of the first edges of the error events.

In step S2, the diagnostic unit 11 compares the diagnostic signal D with a predetermined first threshold SW1. If the diagnostic signal D is greater than or equal to the first threshold SW1, the diagnosis unit 11 increases a counter by a corresponding increment. In step S3, the diagnosis unit 11 compares the increased counter value with a predetermined second threshold SW2. The diagnostic unit 11 then generates the error message F as a function of a result of the comparison with the second threshold SW2. In particular, the diagnostic unit 11 generates the error message F if the counter value or the increased counter value is greater than or equal to the second threshold SW2.

Thus, whereas in step S2 it is checked to some extent whether a relevant error is present during the individual time interval, in step S3 it is determined whether the severity of the error justifies the error message F being generated. The severity of the error may be understood as the severity of the system impact on the corresponding faulty component.

Figure 2:
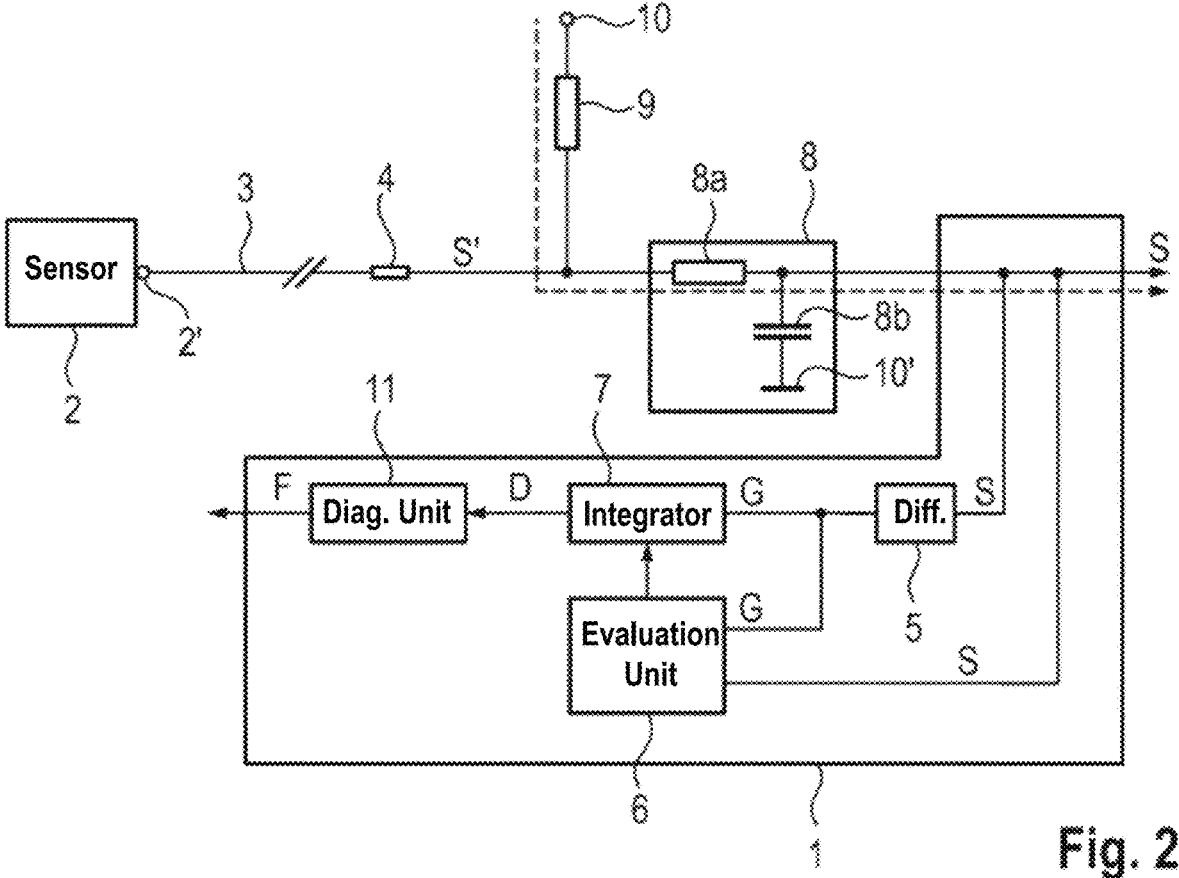
FIG. 2 is an illustrative schematic representation of the diagnostic device and sensor device of FIG. 1 when a first error type is present, according to come aspects of the present disclosure.
Figure 3:
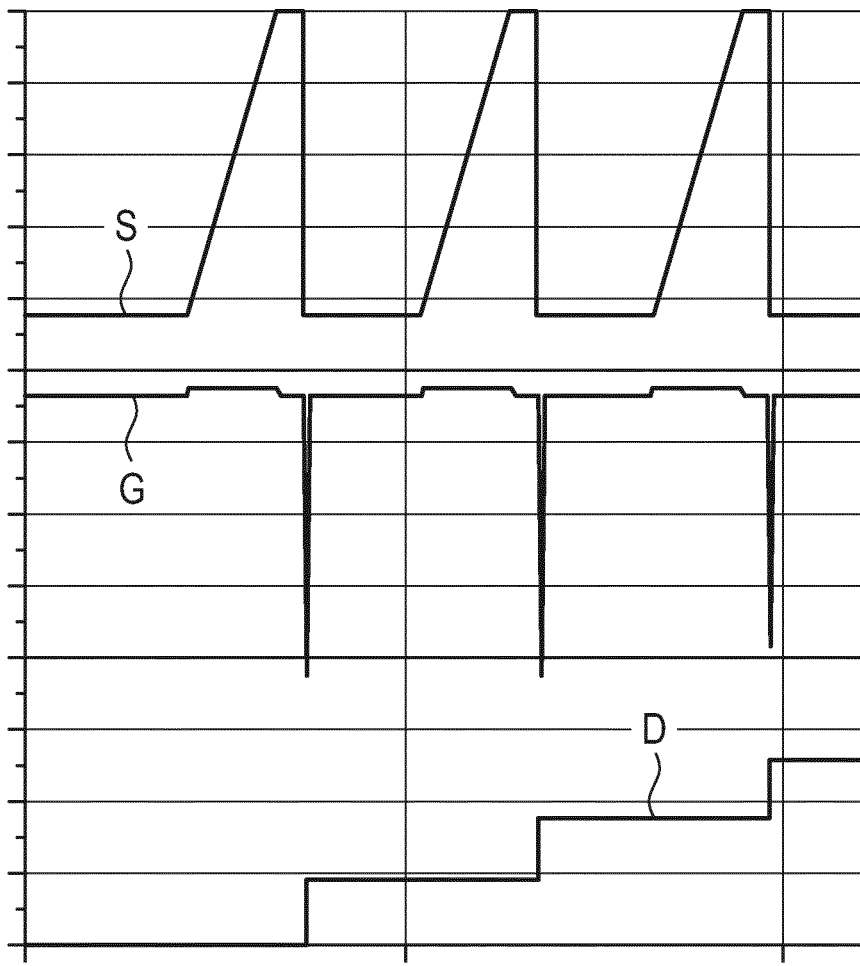
FIG. 3 is an illustrative schematic signal diagram relating to the first error type in FIG. 2, according to come aspects of the present disclosure.

FIG. 2 shows the sensor array and the diagnostic device 1 of FIG. 1, an open circuit of the signal output 2' occurring intermittently, as indicated by two parallel lines between the signal output 2' and the sensor connection 4. FIG. 3 is a corresponding signal diagram, which schematically shows the sensor signal S, the gradient signal G and the diagnostic signal D.

FIG. 3 shows three consecutive error events, which are characterized by consecutive first and second edges of the sensor signal S in each case. The rise in the sensor signal S during the first edge of an error event is less steep than would be the case, for example, for a sudden rise in the sensor signal S. This is because, as can be seen in FIG. 2, the capacitor 8b of the low-pass filter 8 takes place with a delay as a result of the coupling to the first reference potential connection 10 via the resistor 8a and the pull-up resistor 9. However, the first edges of the sensor signal S are each followed by a sudden drop as the second edge. The different edge categories can also be identified from the profile of the gradient signal G. The value of the gradient signal G thus remains relatively small, whereas sharp peaks occur during the second edges.

The diagnostic signal D corresponds to the output of the integrator 7, which, under the control of the evaluation unit 6, integrates the gradient signal G for example during the second edges. Appropriate diagnostic signals can be generated for other error types, in particular short circuits between the signal output 2' and one of the reference potentials 10, 10'.

Figure 4:
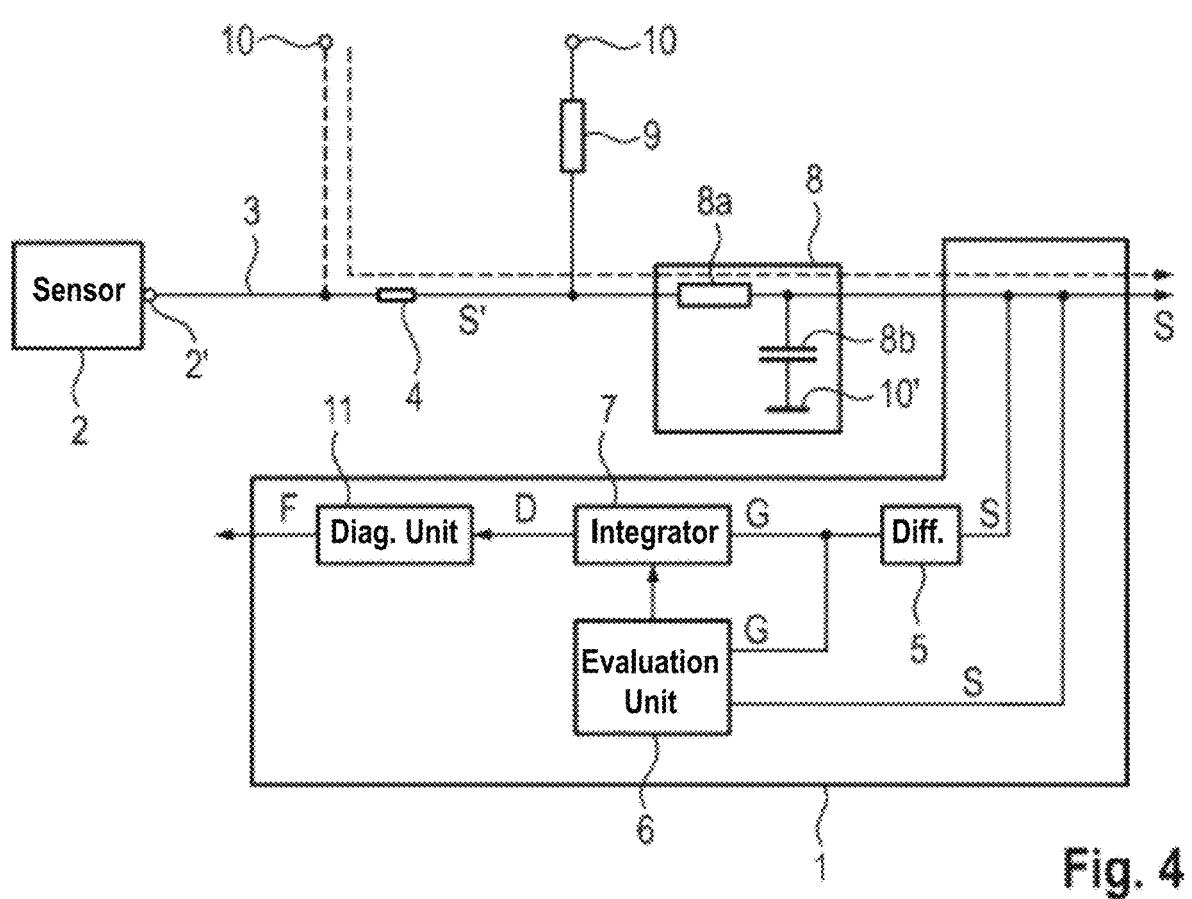
FIG. 4 is an illustrative schematic representation of the diagnostic device and sensor device of FIG. 1 when a second error type is present, according to come aspects of the present disclosure.

FIG. 4 shows the diagnostic device 1 or sensor array, an intermittent short circuit between the signal output 2' of the sensor 2 and the first reference potential connection 10 being indicated by a dashed connecting line. In this case, a current flows from the first reference potential connection 10 via the sensor connection 4 into the low-pass filter 8.

Figure 5:
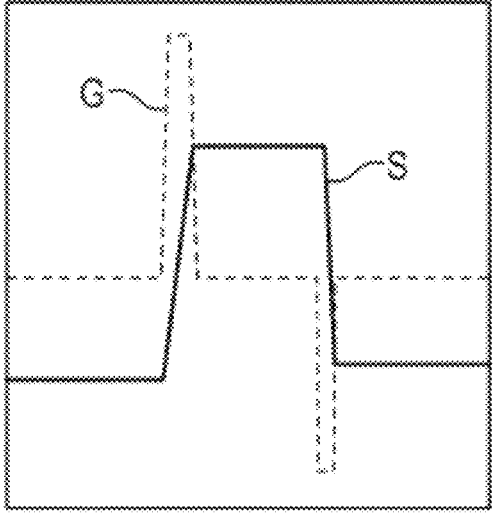
FIG. 5 is an illustrative schematic signal diagram relating to the second error type in FIG. 4, according to come aspects of the present disclosure.

In FIG. 5, the associated sensor signal S and the associated gradient signal G are shown schematically as a function of time. The first edge of the sensor signal S is reflected as a positive signal pulse in the gradient signal G, and the second edge as a negative signal pulse. At the beginning of the first edge, the described short circuit with the reference potential connection 10 is established. As a consequence, there is a sudden rise in the sensor signal S. At the beginning of the second edge, the short circuit is eliminated again, in such a way that the sensor signal S exhibits an approximately equally large sudden drop. The duration of the sudden rise or sudden fall may be of the order of a few milliseconds, for example less than 5 ms. The maximum and minimum values of the gradient signal G may take on magnitudes in the range of several hundreds of V/s or thousands of V/s.

Figure 6:
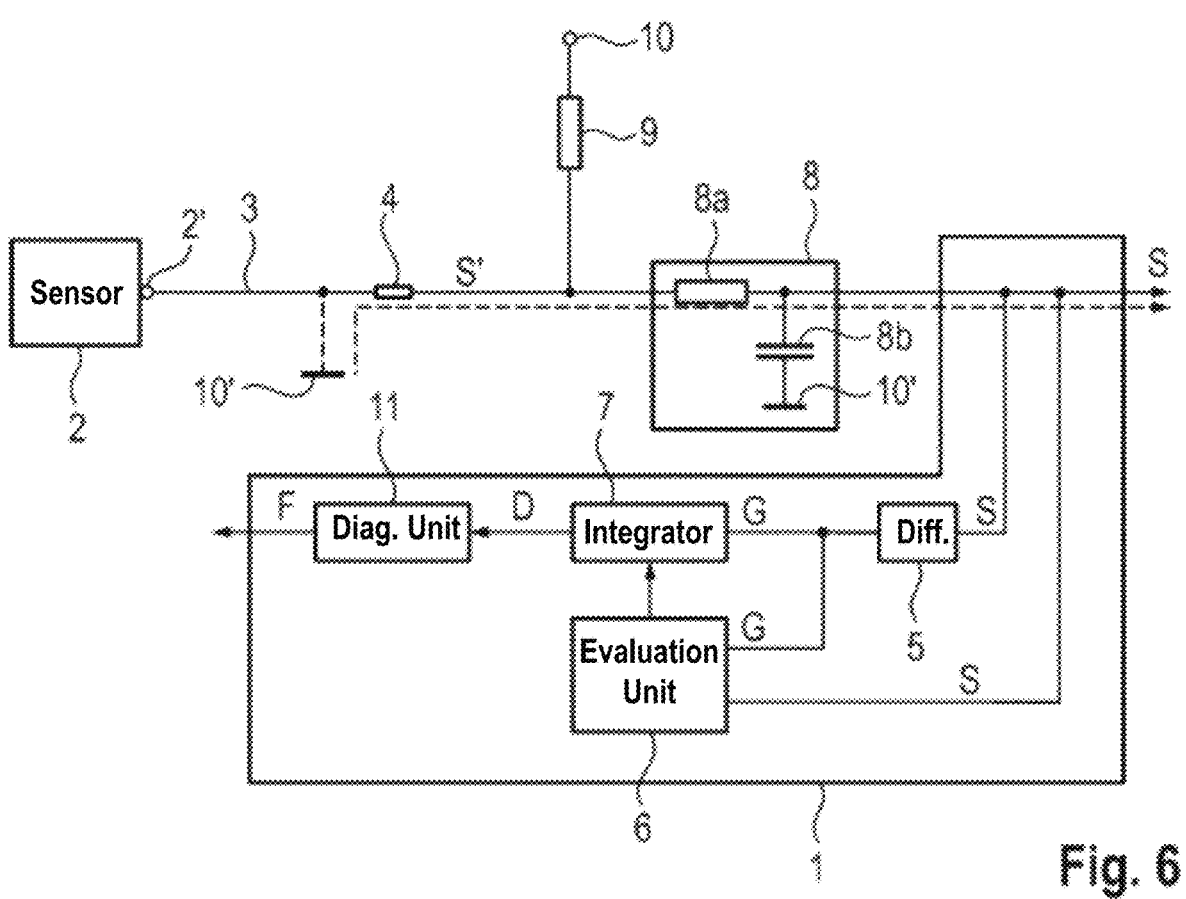
FIG. 6 is an illustrative schematic representation of the diagnostic device and sensor device of FIG. 1 when a third error type is present, according to come aspects of the present disclosure.
Figure 7:
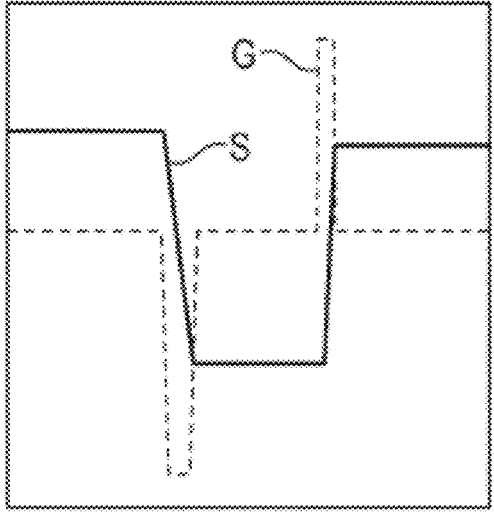
FIG. 7 is an illustrative schematic signal diagram relating to the third error type in FIG. 6, according to come aspects of the present disclosure.

FIG. 6 shows the diagnostic device 1 and the sensor array in a manner corresponding to an intermittent short circuit between the signal output 2' and the second reference potential connection 10'. The associated signal diagram is shown in FIG. 7. The signal profiles here are to some extent the opposite of the situation in FIGS. 4 and 5. The short circuit is thus first created, this being accompanied by a sudden drop in the sensor signal S, and then the short circuit is eliminated again, leading to a corresponding sudden rise in the sensor signal S. As described above, this behavior can be identified with the intermittent short circuit between the signal output 2' and the second reference potential connection 10'.

As described in particular in relation to the drawings, by way of the present disclosure, the severity or relevance of intermittent errors can be estimated and appropriately taken into account.

The presence of intermittent errors in analog sensors can be determined particularly reliably on the basis of various embodiments, and different errors can be reliably distinguished from one another and evaluated. In particular, what are known as jittery signals, which are detected as repeated rising and falling of the sensor signal, can be monitored effectively in this way. As a result, in particular, regulatory requirements for monitoring signals of this type in motor vehicles can be met.

In various embodiments, two edges of the sensor signal are analyzed in such a way that incorrect diagnoses, for example due to load impacts and the like, are avoided.

Aspects of the present disclosure may also be used for other analog electrical or electronic components having an analog output signal that are not sensors. The analog electronic component may be configured as a control unit, for example. In the various embodiments, the sensor signal is then to be replaced with the analog output signal of the analog electronic component.

LIST OF REFERENCE SIGNS

1 Diagnostic device
2 Sensor
2' Signal output
3 Lines
4 Sensor connection
5 Differentiator
6 Evaluation unit
7 Integrator
8 Low-pass filter
8a Resistor
8b Capacitor
9 Pull-up resistor
10, 10' Reference potential connections
11 Diagnostic unit
S Sensor signal
S' Output signal
G Gradient signal
D Diagnostic signal
SW1, SW2 Thresholds
F Error message
S1 to S3 Method steps

The invention claimed is:

1. A method for error analysis in a sensor array of unstable errors of a motor vehicle, comprising:
   receiving, via a diagnostic device coupled to an analog sensor of the motor vehicle, an analog sensor signal as a function of a measured variable;
   identifying, via an edge-detection circuit of the diagnostic device, a number of error events within a predetermined time interval, wherein the analog sensor signal for each error event comprises a first edge and a second edge, following the first edge;
   generating, via an integration circuit of the diagnostic device, a diagnostic signal as a function of a cumulative height of the first edges and/or the second edges, the cumulative height being determined by integrating or summing a measure of change in the analog sensor signal over the predetermined time interval and during the first edges and/or the second edges;
   comparing the diagnostic signal with a first threshold via the diagnostic device;
   determining, based on the comparison, that an unstable error condition is present when the diagnostic signal satisfies the first threshold; and
   in response to determining that the unstable error condition is present, controlling operation of the motor vehicle by at least one of restricting engine torque or adjusting operating parameters of a vehicle control unit.

2. The method according to claim 1, further comprising modifying a counter value via the diagnostic device, depending on the result of the comparison of the diagnostic signal with the first threshold;
   comparing the modified counter value with a second threshold by the diagnostic device; and
   generating the error message as a function of a result of the changed counter value with the second threshold.

3. The method according to claim 1, wherein (i) a start time and end time of the time interval are predetermined, or (ii) a duration of the time interval is predetermined and the start time of the time interval corresponds to the first edge of an initial error event of the number of error events.

4. The method according to claim 1, further comprising:
identifying a totality of error events within the time interval via the diagnostic device, the sensor signal for each error event of the totality of error events having a first edge and a second edge following the first edge;
for each error event of a totality of error events, determining an error type out of at least two predetermined error types by the diagnostic device as a function of an associated first edge and an associated second edge; and
determining that the number of error events correspond to a subset of the totality of error events where the same error type is determined for all error events of the number of error events.

5. The method according to claim 4, further comprising:
generating a gradient signal as a function of the sensor signal;
for each error event of the totality of error events the diagnostic device,
assigning an edge category to the associated first edge, out of at least two predefined edge categories;
assigning an edge category to the associated second edge, out of the at least two edge categories; and
determining the error type as a function of the edge category assigned to the first edge and the edge category assigned to the second edge.

6. The method according to claim 4, wherein the at least two error types comprise an intermittent short circuit between a signal output of the sensor array and a reference potential connection and/or an intermittent open circuit of the signal output.

7. The method according to claim 4, further comprising:
for each error event of the totality of error events the diagnostic device,
assigning the associated first edge to a first edge category out of the at least two edge categories only if the gradient signal exceeds a positive first gradient limit value during the first edge, or
assigning the associated second edge to the first edge category only if the gradient signal exceeds the first gradient limit value during the second edge.

8. The method according to claim 7, further comprising:
for each error event of the totality of error events the diagnostic device,
assigning the associated first edge to a second edge category out of the at least two edge categories only if the gradient signal during the first edge falls below a negative second gradient threshold, or
assigning the associated second edge to the second edge category only if the gradient signal falls below the second gradient limit value during the second edge.

9. The method according to claim 1, wherein the diagnostic signal is generated as a function of a cumulative dwell time of the sensor signal at a predetermined upper limit of the sensor signal and/or at a predetermined lower limit of the sensor signal.

10. A diagnostic device for error analysis in a sensor array of unstable errors of a motor vehicle, comprising:
a diagnostic unit;
an evaluation unit; and
an integration unit, wherein the diagnostic unit, evaluation unit, and integration unit are configured to
receive an analog sensor signal as a function of a measured variable;

identify a number of error events within a predetermined time interval via the evaluation unit, wherein the analog sensor signal for each error event comprises a first edge and a second edge, following the first edge;
generate a diagnostic signal as a function of a cumulative height of the first edges and/or the second edges, the cumulative height being determined by integrating or summing a measure of change in the analog sensor signal over the predetermined time interval and during the first edges and/or the second edges;
compare the diagnostic signal with a first threshold via the diagnostic unit;
determine, based on the comparison, that an unstable error condition is present when the diagnostic signal satisfies the first threshold; and
in response to determining that the unstable error condition is present, control operation of the motor vehicle by at least one of restricting engine torque or adjusting operating parameters of a vehicle control unit.

11. The diagnostic device according to claim 10, wherein the diagnostic unit, evaluation unit, and integration unit are configured to
modify a counter value via the diagnostic device, depending on the result of the comparison of the diagnostic signal with the first threshold;
compare the modified counter value with a second threshold by the diagnostic device; and
generate the error message as a function of a result of the changed counter value with the second threshold.

12. The diagnostic device according to claim 10, wherein (i) a start time and end time of the time interval are predetermined, or (ii) a duration of the time interval is predetermined and the start time of the time interval corresponds to the first edge of an initial error event of the number of error events.

13. The diagnostic device according to claim 10, wherein the diagnostic unit, evaluation unit, and integration unit are configured to:
identify a totality of error events within the time interval via the diagnostic device, the sensor signal for each error event of the totality of error events having a first edge and a second edge following the first edge;
for each error event of a totality of error events, determine an error type out of at least two predetermined error types by the diagnostic device as a function of an associated first edge and an associated second edge; and
determine that the number of error events correspond to a subset of the totality of error events where the same error type is determined for all error events of the number of error events.

14. The diagnostic device according to claim 13, wherein the diagnostic unit, evaluation unit, and integration unit are configured to:
generating a gradient signal as a function of the sensor signal;
for each error event of the totality of error events the diagnostic device,
assign an edge category to the associated first edge, out of at least two predefined edge categories;
assign an edge category to the associated second edge, out of the at least two edge categories; and determine the error type as a function of the edge category assigned to the first edge and the edge category assigned to the second edge.

15. The diagnostic device according to claim 13, wherein the at least two error types comprise an intermittent short circuit between a signal output of the sensor array and a reference potential connection and/or an intermittent open circuit of the signal output.

16. The diagnostic device according to claim 13, wherein the diagnostic unit, evaluation unit, and integration unit being configured to:

for each error event of the totality of error events the diagnostic device, assign the associated first edge to a first edge category out of the at least two edge categories only if the gradient signal exceeds a positive first gradient limit value during the first edge, or assign the associated second edge to the first edge category only if the gradient signal exceeds the first gradient limit value during the second edge.

17. The diagnostic device according to claim 16, wherein the diagnostic unit, evaluation unit, and integration unit being configured to:

for each error event of the totality of error events the diagnostic device, assigning the associated first edge to a second edge category out of the at least two edge categories only if the gradient signal during the first edge falls below a negative second gradient threshold, or assigning the associated second edge to the second edge category only if the gradient signal falls below the second gradient limit value during the second edge.

18. The diagnostic device according to claim 10, wherein the diagnostic signal is generated as a function of a cumulative dwell time of the sensor signal at a predetermined upper limit of the sensor signal and/or at a predetermined lower limit of the sensor signal.

19. A motor vehicle, comprising a diagnostic device for error analysis in a sensor array of unstable errors, the diagnostic device comprising:

a diagnostic unit;

an evaluation unit; and an integration unit, wherein the diagnostic unit, evaluation unit, and integration unit being configured to receive an analog sensor signal as a function of a measured variable;

identify a number of error events within a predetermined time interval via the evaluation unit, wherein the analog sensor signal for each error event comprises a first edge and a second edge, following the first edge;

generate a diagnostic signal as a function of a cumulative height of the first edges and/or the second edges, the cumulative height being determined by integrating or summing a measure of change in the analog sensor signal over the predetermined time interval and during the first edges and/or the second edges;

compare the diagnostic signal with a first threshold via the diagnostic unit; and determine, based on the comparison, that an unstable error condition is present when the diagnostic signal satisfies the first threshold; and in response to determining that the unstable error condition is present, control operation of the motor vehicle by at least one of restricting engine torque or adjusting operating parameters of a vehicle control unit.

20. The motor vehicle of claim 19, wherein the diagnostic device is configured to modify a counter value via the diagnostic device, depending on the result of the comparison of the diagnostic signal with the first threshold;

compare the modified counter value with a second threshold by the diagnostic device; and generate the error message as a function of a result of the changed counter value with the second threshold.

* * * * *